United States Patent

Santo

Patent Number: 5,590,465
Date of Patent: Jan. 7, 1997

[54] METHOD OF MANUFACTURING CONNECTION TERMINALS OF FLEXIBLE WIRING PATTERN SUBSTRATES

[75] Inventor: Kouichi Santo, Obama, Japan

[73] Assignee: Matsushita Electric Industrial Co., Ltd., Kadoma, Japan

[21] Appl. No.: 616,954

[22] Filed: Mar. 15, 1996

Related U.S. Application Data

[63] Continuation of Ser. No. 181,470, Jan. 14, 1994, abandoned.

[30] Foreign Application Priority Data

Jan. 18, 1993 [JP] Japan ................................ 5-005550

[51] Int. Cl.⁶ .................................................. H01R 43/00
[52] U.S. Cl. ............................. 29/884; 29/846; 174/254; 174/261
[58] Field of Search .............................. 29/884, 877, 867, 29/846, 832; 174/253, 254, 267, 261; 439/77

[56] References Cited

U.S. PATENT DOCUMENTS

| | | | |
|---|---|---|---|
| 3,164,716 | 1/1965 | Schenker et al. | 29/867 X |
| 3,399,452 | 9/1968 | Reid et al. | 29/884 |
| 3,772,775 | 11/1973 | Bonnke et al. | 29/884 |
| 4,165,559 | 8/1979 | Lang et al. | 29/867 |
| 4,891,014 | 6/1990 | Simpson et al. | 29/884 X |
| 5,065,506 | 11/1991 | Kiribayaski | 29/832 X |
| 5,134,248 | 7/1992 | Kiec et al. | 29/879 X |
| 5,274,195 | 12/1993 | Murphy et al. | 29/884 X |
| 5,444,188 | 8/1995 | Iwayama et al. | 29/846 X |

FOREIGN PATENT DOCUMENTS 0093081  4/1989  Japan ........................ 29/884

*Primary Examiner*—Peter Vo
*Assistant Examiner*—Khan V. Nguyen
*Attorney, Agent, or Firm*—Cushman, Darby & Cushman

[57] ABSTRACT

A conductive metal wiring pattern 1 is printed and wired on a flexible insulation film 2, and has connection terminals 1a whose surfaces are treated into a solderable state by plating or the like. An overriding flexible insulation film 3 is formed such that it covers a portion excluding the connection terminals 1a. The connection terminals 1a are easily formed by printing, bonding and cutting out portions of the insulation film 2 between the connection terminals by a press to separate the connection terminal.

1 Claim, 3 Drawing Sheets

FIG.3(a) (Prior Art)    FIG.3(b) (Prior Art)
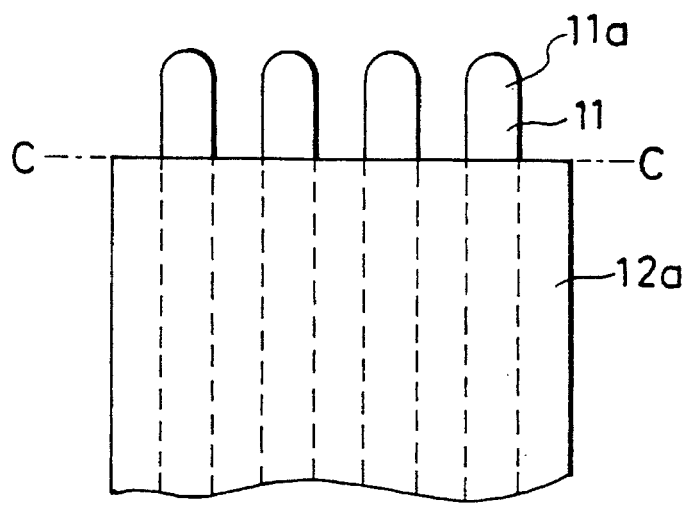 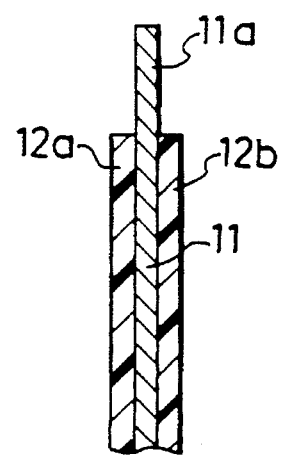
FIG.4 (Prior Art)
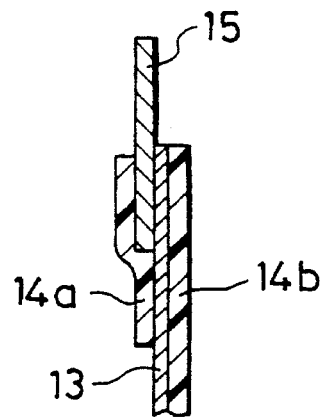

METHOD OF MANUFACTURING CONNECTION TERMINALS OF FLEXIBLE WIRING PATTERN SUBSTRATES

This is a continuation of application Ser. No. 08/181,470, filed Jan. 14, 1994, which was abandoned upon the filing hereof.

FIELD OF THE INVENTION AND RELATED ART STATEMENT

1. Field of the Invention

This invention relates to connection terminals of a flexible pattern substrate used in a flexible substrate which is widely used in audio/video apparatus and office automation apparatus (hereinafter called AV and OA apparatus).

2. Description of Related Art

Recently, AV and OA apparatus are light in weight and are miniaturized, and at the same time the use of a flexible pattern substrate in these apparatus is increasing. However, the connection terminals of the flexible pattern substrate were still expensive in comparison with a low cost tendency of the whole apparatus, and a low cost trend of the flexible pattern substrate has its limit.

Connection terminals of a conventional flexible pattern substrate will be explained with reference to FIG. 3(a) and FIG. 3(b). FIG. 3(a) is a plan view showing connection terminals of a conventional flexible pattern substrate, and FIG. 3(b) is a side sectional view of the connection terminals of FIG. 3(a).

In FIGS. 3(a) and 3(b), a conductive metal wiring pattern 11 is interposed and wired between an insulation substrate 12a and an insulation substrate 12b.

Next, a method of manufacturing the conventional flexible pattern substrate of the prior art will be explained. First, the conductive metal wiring pattern 11 is interposed between the insulation substrate 12a and the other insulation substrate 12b, and they all are adhered and fixed. Then, a cutout is made on a border line C—C between a portion to be exposed and a portion to be unexposed of the conductive metal wiring pattern 11, so as to enable peeling off of the insulation substrate 12a and the other insulation substrate 12b. By the above-mentioned process, connection terminals 11a of the conductive metal wiring pattern 11 are exposed as connectors for the conductive metal wiring pattern 11.

FIG. 4 shows another conventional example of connection terminals of a flexible pattern substrate. FIG. 4, a conductive metal wiring pattern 13 is interposed between an insulation substrate 14a and an insulation substrate 14b. A connection terminal 15 can be soldered to metal. The connection terminal 15 is interposed between the insulation substrate 14a and the conductive metal wiring pattern 13, and the connection terminal 15 and the conductive metal wiring pattern 13 are electrically connected. The insulation substrate 14a and the insulation substrate 14b are heat-welded and fixed.

FIG. 5 is a side sectional view showing a connecting state of conventional connection terminals 11a to a circuit board. As shown in FIG. 5, a way of the connection between a circuit board and the connection terminals 11a of the conventional flexible pattern substrate has been performed by inserting the connection terminal 11a into a hole 17 of an insulation substrate 16 of the circuit board, followed by soldering between a conductive metal wiring pattern 16a printed on the insulation substrate 16 and the connection terminal 11a, as shown in FIG. 5. FIG. 6 is a side sectional view showing another connecting state of a conventional connection terminals to a circuit board. As shown in FIG. 6, the way the connection has been performed is by connecting with solder 19 between a conductive metal wiring pattern 18a on an insulation substrate 18 and the connection terminal 15 of the conventional flexible pattern substrate.

The above-mentioned conventional configuration becomes very expensive because the conductive metal wiring pattern 11 of the flexible substrate of FIG. 3(a), FIG. 3(b) and FIG. 5 is formed by etching. Furthermore, the connection terminals 11a are formed of the conductive metal wiring pattern 11 in the flexible insulation substrate, therefore a step for peeling off the flexible insulation substrates is required. On the other flexible pattern substrate shown in FIG. 4 and FIG. 6, it is necessary to fix the metal terminals 15 to the conductive metal wiring pattern 13. Thus the manufacturing cost of the conventional flexible pattern substrate becomes very expensive.

OBJECT AND SUMMARY OF THE INVENTION

An object of the invention is to provide connection terminals of a flexible pattern substrate. which can be manufactured with low cost and can be connected to a printed board by soldering.

In order to achieve the object of the invention, a connection terminals of a flexible pattern substrate comprises a flexible insulation substrate, a predetermined conductive metal wiring pattern of conductive paste provided on the flexible insulation substrate, metal-plated regions to serve as connection terminals provided on the conductive metal wiring pattern, and an overriding flexible insulation substrate formed by covering a portion excluding the connection terminals.

And, in order to achieve the object of the invention, a method of manufacturing connection terminals which comprises step of printing and wiring a predetermined conductive metal wiring pattern with conductive paste on a flexible insulation substrate, step of plating at least regions to become connection terminals of the conductive metal wiring pattern, step of covering a portion excluding the region to become connection terminals with an overriding flexible insulation substrate, and step of cutting out portions of the flexible insulation substrates between the plated connection terminals by a press.

By using the above method, it is not necessary to form conductive metal wiring terminals by etching, therefore a manufacturing cost for such terminals becomes very inexpensive. Furthermore, it becomes unnecessary to peel off a part of the flexible insulation substrate for using the conductive metal wiring pattern as terminals. In addition, a process of fixing the metal terminals is eliminated. Thus the manufacturing cost for the flexible pattern substrate is greatly reduced.

According to the present invention, the connection terminals of the flexible pattern substrate of the present invention can be formed very easily into solderable terminals by printing with conductive paint and plating, thereby providing a very inexpensive wiring substrate.

While the novel features of the invention are set forth particularly in the appended claims, the invention, both as to organization and content, will be better understood and appreciated, alone with other objects and features thereof, from the following detailed description taken in conjunction with the drawings.

BRIEF DESCRIPTION OF THE DRAWINGS

FIG. 3(a) is the plan view showing the connection terminals of the conventional flexible pattern substrate, FIG. 3(b) is the side sectional view showing the connection terminals of FIG. 3(a), FIG. 4 is the side sectional view showing the connection terminals of another conventional flexible pattern.

It will be recognized that some or all of the Figures are schematic representations for purposes of illustration and do not necessarily depict the actual relative sizes or locations of the elements shown.

DESCRIPTION OF THE PREFERRED EMBODIMENT

Figure 1A:
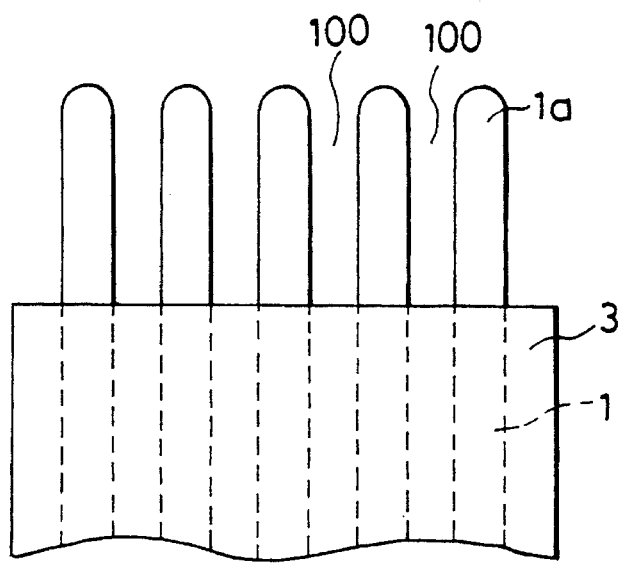
FIG. 1(a) is a plan view showing connection terminals of a flexible pattern substrate of one embodiment of the present invention.
Figure 1B:
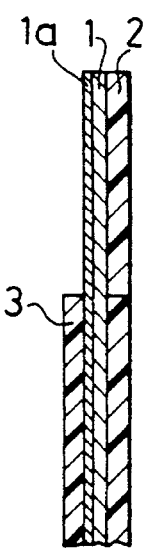
FIG. 1(b) is a side sectional view showing the connection terminals of FIG. 1(a)
Figure 2:
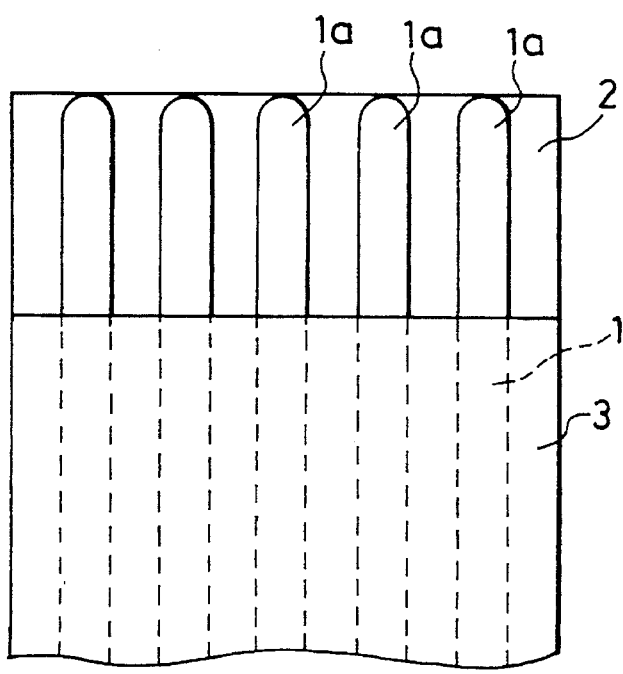
FIG. 2 is a plan view showing the connection terminals of FIG. 1(a) in manufacturing process.
Figure 5:
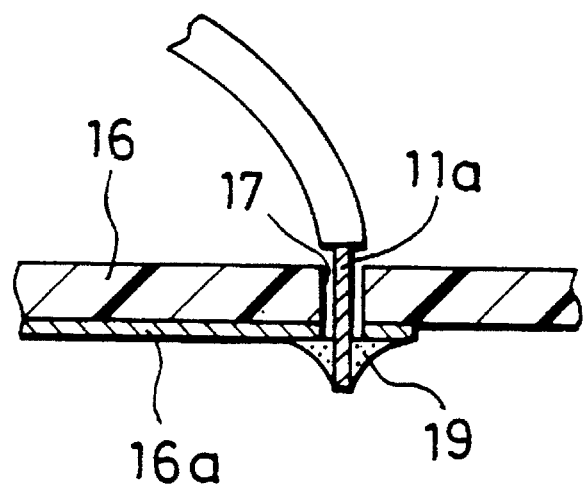
FIG. 5 is the side sectional view showing the connecting state of the conventional connection terminals to the circuit board.

Hereafter, connection terminals of a flexible pattern substrate of one embodiment in accordance with the present invention will be explained with reference to FIG. 1(a), FIG. 1(b) and FIG. 2. FIG. 1(a) is a plan view showing connection terminals of a flexible pattern substrate of one embodiment of the present invention. FIG. 1(b) is a side sectional view showing The connection terminals of FIG. 1(a). FIG. 2 is a plan view showing the connection terminals of FIG. 1(a) in manufacturing process.

In FIGS. 1(a) and 1(b), a conductive metal wiring pattern 1 is formed on a first flexible insulation film 2 by printing with a conductive paint. It is desirable that the first flexible insulation film 2 is formed to have 10 µm to 1 mm thickness. And connection terminals 1a, which are end parts of the conductive metal wiring pattern 1, are procreated by plating an easily solderable metal, such as solder, copper, nickel, silver or gold, so that their surfaces can be easily soldered. The connection terminals 1a is formed by electroplating or a non-electrolytic plating process. It is desirable that the connection terminal 1a is formed to have 10 µm to 40 µm thickness and the conductive metal wiring pattern 1 is formed to have 1 µm to 80 µm thickness. A second flexible insulation film 3 is formed by adhering or printing, so as to cover a portion excluding the connection terminals 1a. The first and second flexible insulation films 2 and 3 are made of polyester resin or polyimide resin or the like and of 10 µm to 1 µm thickness.

As shown in FIG. 2, this manufacturing method for the above-mentioned flexible pattern substrate comprises the following processes:

In a first step, the conductive metal wiring pattern 1 is printed with the conductive paste, such as adhesive containing fine particles, such as copper metal or silver metal or the like, on the conductive metal wiring pattern 1 on the first flexible insulation film 2. The conductive metal wiring pattern 1 is formed to have 1 µm to 30 µm thickness.

In a second step, at least a portion of connection terminals 1a is plated with metal, such as solder, copper, nickel, silver or gold or the like. The connection terminals 1a is formed by an electroplating or a non-electrolytic plating. It is desirable that the connection terminal 1a is formed to have 10 µm to 40 µm thickness.

In a third step, the second flexible insulation film 3 is formed by thermo-compression bonding of the plastic film, such as polyester film or polyimide film, to cover a portion excluding the connection terminals 1a.

In the last step, inter-teeth portions 100 of the first flexible insulation film 2 between the connection terminals 1a are cut out by a press, thereby to separate the connection terminals 1a like comb teeth, and thus flexible pattern substrate is manufactured.

Figure 6:
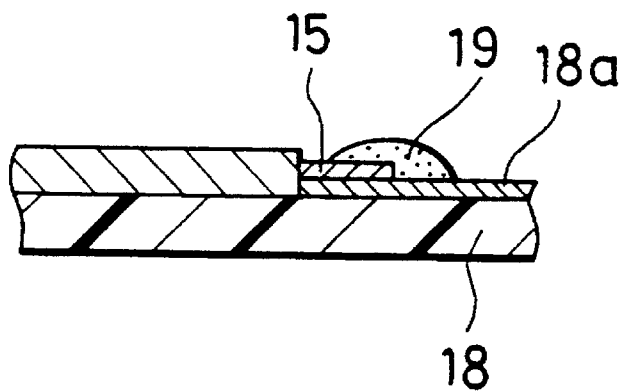
FIG. 6 is the side sectional view showing another connecting state of the conventional connection terminals to the circuit board.

The connection terminals 1a of the present invention can be used by fixing on and connecting to a known electric connector by inserting them or by soldering like the manner of FIG. 6 for electric connection.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A method of manufacturing connection terminals of a flexible wiring pattern substrate comprising:

printing and writing a predetermined conductive metal wiring pattern with conductive paste on a first flexible insulation substrate, plating metal on at least a portion of said conductive metal wiring pattern thereby defining plated connection terminals, said plated connection terminals being located at an end of said substrate, covering said substrate excluding said plated connection terminals with an overriding, second flexible insulation substrate, and cutting out portions of said first flexible insulation substrate at said end of the substrate between said plated connection terminals by a press to separate said plated connection terminals.

\* \* \* \* \*